United States Patent
Marsella et al.

(10) Patent No.: US 6,281,170 B1
(45) Date of Patent: Aug. 28, 2001

(54) SURFACE TENSION REDUCTION WITH N,N, N'-TRIALKKYL UREAS

(75) Inventors: John Anthony Marsella, Allentown; Kevin Rodney Lassila, Macungie, both of PA (US); Robert Lee Fowlkes, Milton, FL (US)

(73) Assignee: Air Products and Chemicals, Inc., Allentown, PA (US)

(*) Notice: Subject to any disclaimer, the term of this patent is extended or adjusted under 35 U.S.C. 154(b) by 0 days.

(21) Appl. No.: 09/420,214

(22) Filed: Oct. 18, 1999

(51) Int. Cl.[7] .............. A01N 25/30; C09D 11/02; C09D 5/02; C09J 11/06; G03F 7/32

(52) U.S. Cl. ............ 504/362; 514/788; 514/975; 106/31.13; 106/124.1; 438/906; 516/203; 510/128

(58) Field of Search ............... 504/362; 514/788, 514/975; 106/31.13, 124.1; 438/906; 516/203; 510/128

(56) References Cited

U.S. PATENT DOCUMENTS

| | | | |
|---|---|---|---|
| 2,335,862 | 12/1943 | Klingel | 167/24 |
| 2,374,187 | 4/1945 | Flett | 252/152 |
| 2,708,183 | 5/1955 | Ramsey et al. | 252/137 |
| 3,691,082 | 9/1972 | Stimberg et al. | 252/98 |
| 3,814,705 | 6/1974 | Inamorato et al. | 252/525 |
| 3,965,015 | 6/1976 | Bauman | 252/8.75 |
| 4,272,413 | 6/1981 | Bauman | 252/8.8 |
| 4,833,067 | 5/1989 | Tanaka et al. | 430/309 |
| 5,098,478 | 3/1992 | Krishnan et al. | 106/20 |
| 5,543,268 | 8/1996 | Tanaka et al. | 430/309 |
| 5,562,762 | 10/1996 | Mrvos et al. | 106/22 R |
| 5,922,522 | 7/1999 | Barr et al. | 430/493 |
| 5,972,431 | 10/1999 | Marsella et al. | 427/384 |
| 5,985,968 | 11/1999 | Lassila et al. | 524/211 |

FOREIGN PATENT DOCUMENTS

| | | |
|---|---|---|
| 19853216 | 6/1999 | (DE). |
| 0791564 | 1/1997 | (EP). |
| 0916393 | 11/1998 | (EP). |

OTHER PUBLICATIONS

Schwartz, J. "The Importance of Low Dynamic Surface Tension in Waterborne Coatings", Journal of Coatings Technology, Sep. 1992.

Wirth, W.; Storp, S.; Jacobsen, W. "Mechanisms Controlling Leaf Retention of Agricultural Spray Solutions", Pestic. Sci. 1991, 33, 411–420.

Medina, S. W.; Sutovich, M. N., "Using Surfactants to Formulate VOC Compliant Waterbased Inks", Am. Ink Maker 1994, 72 (2), 32–38.

Sheats, J. R. and Smith, B. W.; "Microlithography, Science and Technology", Marcel Dekker, Inc., 1998, pp 551–553.

US application Ser. No. 09/418,666 filed Oct. 14, 1999, "Alkylated Aminoalkyl Cyclic Urea Surfactants".

*Primary Examiner*—S. Mark Clardy
(74) *Attorney, Agent, or Firm*—Michael Leach

(57) ABSTRACT

This invention provides water-based compositions, particularly coating, ink, adhesive, fountain solution, agricultural and photoresist developer compositions, manifesting reduced equilibrium and dynamic surface tension by the incorporation of a surface tension reducing amount of certain trialkyl urea compounds of the structure

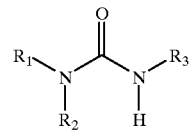

where $R_1$ and $R_2$ are C2 to C6 alkyl groups, $R_3$ is methyl or ethyl, and the total number of carbon atoms in $R_1$, $R_2$ and $R_3$ is from 6 to 14.

23 Claims, No Drawings

SURFACE TENSION REDUCTION WITH N,N, N'-TRIALKKYL UREAS

FIELD OF THE INVENTION

The invention relates to the use of N,N,N'-trialkyl ureas to reduce the surface tension in water-based systems.

BACKGROUND OF THE INVENTION

The ability to reduce the surface tension of water is of great importance in waterborne coatings, inks, adhesives, fountain solutions, agricultural formulations and cleaning compositions for electronics processes such as semiconductor manufacture because decreased surface tension translates to enhanced substrate wetting in actual formulations. Surface tension reduction in water-based systems is generally achieved through the addition of surfactants. Performance attributes resulting from the addition of surfactants include enhanced surface coverage, fewer defects, and more uniform distribution. Equilibrium surface tension performance is important when the system is at rest. However, the ability to reduce surface tension under dynamic conditions is of great importance in applications where high surface creation rates are utilized. Such applications include spraying, rolling and brushing of coatings or spraying of agricultural formulations, or high speed gravure or ink-jet printing. Dynamic surface tension is a fundamental quantity which provides a measure of the ability of a surfactant to reduce surface tension and provide wetting under such high speed application conditions.

Traditional nonionic surfactants such as alkylphenol or alcohol ethoxylates, and ethylene oxide (EO)/propylene oxide (PO) copolymers have excellent equilibrium surface tension performance but are generally characterized as having poor dynamic surface tension reduction. In contrast, certain anionic surfactants such as sodium dialkyl sulfosuccinates can provide good dynamic results, but these are very foamy and impart water sensitivity to the finished coating.

There is a need for surfactants which exhibit good equilibrium and dynamic surface tension properties, are low-foaming, are low viscosity liquids to facilitate handling, have low color and low odor characteristics and would be widely accepted in the waterborne coating, ink, adhesive, fountain solution, agricultural formulation and the electronics manufacturing industries.

The importance of reducing equilibrium and dynamic surface tension in applications such as coatings, inks, adhesives, fountain solutions, agricultural formulations and electronics cleaning compositions, e.g., aqueous developer solutions for making semiconductor devices, is well-appreciated in the art.

Low dynamic surface tension is of great importance in the application of waterborne coatings. In an article, Schwartz, J. "The Importance of Low Dynamic Surface Tension in Waterborne Coatings", Journal of Coatings Technology, September 1992, there is a discussion of surface tension properties in waterborne coatings and a discussion of dynamic surface tension in such coatings. Equilibrium and dynamic surface tension were evaluated for several surface active agents. It is pointed out that low dynamic surface tension is an important factor in achieving superior film formation in waterborne coatings. Dynamic coating application methods require surfactants with low dynamic surface tensions in order to prevent defects such as retraction, craters, and foam.

Efficient application of agricultural products is also highly dependent on the dynamic surface tension properties of the formulation. In an article, Wirth, W.; Storp, S.; Jacobsen, W. "Mechanisms Controlling Leaf Retention of Agricultural Spray Solutions"; Pestic. Sci. 1991, 33, 411–420, the relationship between the dynamic surface tension of agricultural formulations and the ability of these formulations to be retained on a leaf was studied. These workers observed a good correlation between retention values and dynamic surface tension, with more effective retention of formulations exhibiting low dynamic surface tension.

Low dynamic surface tension is also important in high-speed printing as discussed in the article "Using Surfactants to Formulate VOC Compliant Waterbased Inks", Medina, S. W.; Sutovich, M. N. Am. Ink Maker 1994, 72 (2), 32–38. In this article, it is stated that equilibrium surface tensions (ESTs) are pertinent only to ink systems at rest. EST values, however, are not good indicators of performance in the dynamic, high speed printing environment under which the ink is used. Dynamic surface tension is a more appropriate property. This dynamic measurement is an indicator of the ability of the surfactant to migrate to a newly created ink/substrate interface to provide wetting during high speed printing.

Tetramethylammonium hydroxide (TMAH) is the chemical of choice in aqueous alkaline solutions for developing photoresists according to Microlithography, Science and Technology, edited by J. R. Sheats and B. W. Smith, Marcel Dekker, Inc., 1998, pp 551–553. Surfactants are added to the aqueous TMAH solutions to reduce development time and scumming and to improve surface wetting.

U.S. Pat. No. 5,098,478 discloses water-based ink compositions comprising water, a pigment, a nonionic surfactant and a solubilizing agent for the nonionic surfactant. Dynamic surface tension in ink compositions for publication gravure printing must be educed to a level of about 25 to 40 dynes/cm to assure that printability problems will not be encountered.

U.S. Pat. No. 5,562,762 discloses an aqueous jet ink of water, dissolved dyes and a tertiary amine having two polyethoxylate substituents and that low dynamic surface tension is important in ink jet printing.

U.S. Pat. No. 3,814,705 discloses the use of long chain dialkyl ureas of the type $R_2NC(O)NH_2$ (R=alkyl group of C8 to C18) as foam suppressants in detergent compositions containing sulfate and sulfonate detergents.

U.S. Pat. No. 3,691,082 discloses ureas having at least sixteen N,N'-disubstituent carbons, in combination with isocyanurates, as components of low foam cleaning compositions, again, in the presence of an additional component which provides the surfactancy and detergency for the cleaning composition.

U.S. Pat. No. 2,708,183 discloses ureas of the type RNHC(O)NR'R", where R is a long chain (C8 or greater) hydrocarbon radical, and R' and R" are H or alkyl groups containing up to 6 total carbons. The urea is used in the presence of a sulfated or sulfonated detergent.

U.S. Pat. No. 2,374,187 discloses the use of ureas in conjunction with sulfonated detergents for non-allergenic toilet bars, used as replacements for conventional soap bars. The role of the ureas appears to be to control the rate of disintegration of the toilet bar.

U.S. Pat. No. 4,272,413 discloses the use of disubstituted ureas in detergent compositions as textile softening and antistatic agents, the ureas having the formula RNH-CONHR' where R is a C1–C6 alkyl and R' is a C8–C22 secondary aliphatic hydrocarbon chain.

U.S. Pat. No. 3,965,015 discloses ureas based on diamines for use in detergent compositions as textile softening and antistatic agents.

U.S. Pat. No. 2,335,862 discloses N,N-dibutylurea as a good solvent for rotenone in a non-aqueous herbicidal application.

U.S. Pat. No. 4,833,067 discloses aqueous developing solutions for positive-working photoresist compositions containing an organic basic compound free from metallic ions, such as tetramethylammonium hydroxide and choline, as the main ingredient and 50 to 5000 ppm of an acetylenic alcohol. These aqueous developing solutions are said to have increased surface wetting and decreased foaming.

U.S. Pat. No. 5,543,268 discloses aqueous developer solutions for the treatment of an actinic ray-sensitive resist for the manufacture of semiconductor devices exhibiting reduced scum deposition comprising a nitrogen-containing organic base, e.g., tetramethyl ammonium hydroxide, and a diphenyl ether compound having at least one ammonium sulfonate group.

U.S. Pat. No. 5,922,522 discloses an alkaline aqueous developing solution for developing photoresists containing an ethoxylated surfactant.

SUMMARY OF THE INVENTION

This invention provides water-based compositions containing an organic or inorganic compound, particularly aqueous organic coating, ink, adhesive, fountain solution, agricultural and electronics cleaning compositions, having reduced equilibrium and dynamic surface tension by incorporation of an effective amount of an N,N,N'-trialkyl urea of the following structure:

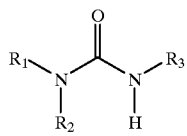

where $R_1$ and $R_2$ are C2 to C6 alkyl groups, $R_3$ is methyl or ethyl, and the total number of carbon atoms in $R_1$, $R_2$ and $R_3$ is from 6 to 14. It is desirable that an aqueous solution of the N,N,N'-trialkyl urea demonstrates a dynamic surface tension of less than 45 dynes/cm at a concentration of $\leq 5$ wt % in water at 23° C. and 1 bubble/second according to the maximum-bubble pressure method. The maximum-bubble-pressure method of measuring surface tension is described in Langmuir 1986, 2, 428–432, which is incorporated by reference.

By "water-based", "aqueous" or "aqueous medium" we mean, for purposes of this invention, a solvent or liquid dispersing medium which comprises at least 90 wt %, preferably at least 95 wt %, water. Obviously, an all water medium is also included.

Also provided is a method for lowering the equilibrium and dynamic surface tension of such aqueous compositions by the incorporation of these N,N,N'-trialkyl urea compounds.

Also provided is a method for applying a coating of a water-based inorganic or organic compound-containing composition to a surface to partially or fully coat the surface with the water-based composition, the composition containing an effective amount of an N,N,N'-trialkyl urea compound of the above structure for reducing the dynamic surface tension of the water-based composition.

There are significant advantages associated with the use of these N,N,N'-trialkyl ureas in water-based organic coatings, inks, adhesives, fountain solutions, agricultural and electronic cleaning compositions and these advantages include:

- an ability to formulate water-borne coatings, inks, adhesives, fountain solutions and agricultural compositions which may be applied to a variety of substrates with excellent wetting of substrate surfaces including contaminated and low energy surfaces;
- an ability to provide a reduction in coating or printing defects such as orange peel and flow/leveling deficiencies;
- an ability to formulate water-borne coating and ink compositions capable of high speed application;
- an ability to produce low-foam surfactants capable of reducing dynamic surface tension;
- an ability to produce water-borne coatings and inks which have low volatile organic content, thus making these formulations environmentally favorable; and
- an ability to formulate low surface tension aqueous electronics cleaning and processing solutions, including photoresist developer solutions, for the semiconductor manufacturing industry with good wetting and extremely low foam.

Because of their excellent surfactant properties and the ability to control foam, these materials are likely to find use in many applications in which reduction in dynamic and equilibrium surface tension and low foam are important. Applications in which low foam is important include various wet-processing textile operations, such as dyeing of fibers, fiber souring, and kier boiling, where low-foaming properties would be particularly advantageous; they may also have applicability in soaps, water-based perfumes, shampoos, and various detergents where their marked ability to lower surface tension while simultaneously producing substantially no foam would be highly desirable.

In addition, the demands of the semiconductor fabrication industry have led to the requirement for high performance surfactants and wetting agents for photoresist developer formulations. As line features shrink to smaller sizes and photoresist substrate materials become more aliphatic in nature (i.e., lower surface energy), aqueous developer solutions increasingly are being formulated with surface tension reducing agents.

An additional requirement for these developers, accentuated by the move toward larger wafer sized, is that they exhibit low foam. This is particularly important when the so-called spray puddle techniques are used in applying the developer solution, wherein the developer is sprayed over increasingly larger areas. Even in cases where puddle or immersion techniques are used, microbubble entrainment during spreading of the solution over the photoresist surface can lead to defects. The materials according to the present invention give efficient reduction of surface tension of aqueous developer solutions and exceedingly low foam, even under extreme conditions. Other applications in the electronics industry using aqueous processing media would also benefit from good dynamic wetting and low foam.

DETAILED DESCRIPTION OF THE INVENTION

This invention relates to the use of compounds of the structure

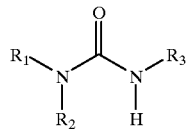

where $R_1$ and $R_2$ are C2 to C6 alkyl groups, $R_3$ is methyl or ethyl, and the total number of carbon atoms in $R_1$, $R_2$ and $R_3$ is from 6 to 14, for the reduction of equilibrium and dynamic surface tension in water-based compositions containing an organic compound, particularly coating, ink, fountain solution, adhesive, agricultural and electronics processing compositions containing organic compounds such as polymeric resins, organic bases, herbicides, fungicides, insecticides or plant growth modifying agents. It is desirable that an aqueous solution of the N,N,N'-trialkyl urea demonstrates a dynamic surface tension of less than 45 dynes/cm at a concentration of $\leq 5$ wt % in water at 23° C. and 1 bubble/second according to the maximum-bubble-pressure method. The maximum-bubble-pressure method of measuring surface tension is described in *Langmuir* 1986, 2, 428–432, which is incorporated by reference.

In one aspect of the invention the N,N,N'-trialkyl ureas of the above formula display excellent ability to reduce equilibrium and dynamic surface tension while producing substantially no foam.

These materials may be prepared by heating a dialkylamine with an N,N'-dialkylurea. This reaction is illustrated below:

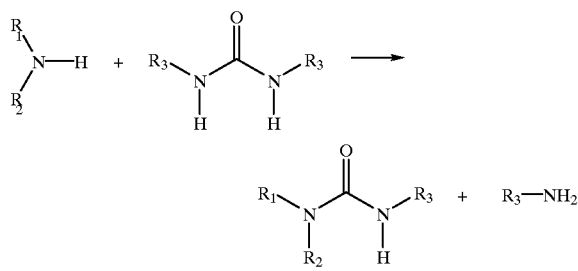

Ureas suitable for the preparation of the compounds of this invention include N,N'-dimethylurea and N,N'-diethylurea which are easily prepared from urea and the primary amines. Dimethylurea is commercially available.

Any secondary amine containing the requisite C2 to C6 alkyl substituents may be utilized for the preparation of the compounds of this invention. Amines which contain a total of 8–10 carbons are preferred. Alkyl groups which are suitable should have sufficient carbon to confer surface activity (i.e. an ability to reduce the surface tension of water) to the material but not enough carbon to decrease the solubility to the extent that the ability of the material to reduce surface tension is insufficient for a particular application. In general, an increase in the carbon number increases the efficiency of the resulting urea surfactant (i.e. less surfactant is required to obtain a given decrease in surface tension) but decreases its ability to reduce surface tension at high surface creation rates. The latter effect is a result of the fact that increased carbon number generally decreases the water solubility of the material, and consequently, diminishes the diffusive flux of surfactant to newly-created surface. Generally, in the practice of this invention, it is desirable to choose alkyl groups such that the resulting trialkylureas have a solubility limit in water from 0.001 to 10.0 wt %, preferably from 0.01 to 2 wt %, and most preferably from 0.1 to 1.5 wt %.

The alkyl groups on the amine may be the same or different. They may be linear or branched, and the point of attachment to the nitrogen may be on either an internal or terminal carbon. The total number of carbons on $R_1$ and $R_2$ should be greater than about 5; fewer than this diminishes the surface activity of the urea too greatly. The total number of carbons should be less than about 12; a greater number decreases the solubility of the material to such a degree that its use in many formulations is impractical. Examples of suitable $R_1$ and $R_2$ are ethyl, n-propyl, isopropyl, n-butyl, isobutyl, sec-butyl, n-pentyl, 2-pentyl, 3-pentyl, isopentyl, n-hexyl, 2-hexyl, 3-hexyl, cyclohexyl, and so on. Preferred derivatives are those in which $R_1$ and $R_2$ contain a total of 6 to 12 alkyl carbons, and derivatives containing 8 to 10 alkyl carbons are most preferred. The alkyl carbons may be distributed among $R_1$ and $R_2$ in any manner, although derivatives in which the alkyl groups contain equivalent numbers of carbons are preferred because parent amines of this type are the most economical and readily available.

An amount of the trialkyl urea compound that is effective to reduce the equilibrium and/or dynamic surface tension of the water-based, inorganic or organic compound-containing composition is added. Such effective amount may range from 0.001 to 20 g/100 mL, preferably 0.01 to 10 g/100 mL, of the aqueous composition. Naturally, the most effective amount will depend on the particular application and the solubility of the N,N,N'-trialkyl urea.

The trialkyl ureas are suitable for use in an aqueous composition comprising in water an inorganic compound which is, for example, a mineral ore or a pigment or an organic compound which is a pigment, a polymerizable monomer, such as addition, condensation and vinyl monomers, an oligomeric resin, a polymeric resin, a detergent, a caustic cleaning agent, a dissolution agent such as trimethylammonium hydroxide (TMAH), a herbicide, a fungicide, an insecticide, or a plant growth modifying agent.

In the following water-based organic coating, ink, adhesive, fountain solution, agricultural and photoresist developer compositions containing a trialkyl urea according to the invention, the other listed components of such compositions are those materials well known to the workers in the relevant art.

A typical water-based protective or decorative organic coating composition to which the trialkyl urea surfactants of the invention may be added would comprise in an aqueous medium 30 to 80 wt % of a coating composition containing the following components:

| Water-Based Organic Coating Composition | |
|---|---|
| 0 to 50 wt % | Pigment Dispersant/Grind Resin |
| 0 to 80 wt % | Coloring Pigments/Extender Pigments/Anti-Corrosive Pigments/Other Pigment Types |
| 5 to 99.9 wt % | Water-Borne/Water-Dispersible/Water-Soluble Resins |
| 0 to 30 wt % | Slip Additives/Antimicrobials/Processing Aids/Defoamers |
| 0 to 50 wt % | Coalescing or Other Solvent |
| 0.01 to 10 wt % | Surfactant/Wetting Agent/Flow and Leveling Agents |
| 0.01 to 5 wt % | Trialkyl Urea |

A typical water-based ink composition to which the trialkyl urea surfactants of the invention may be added would comprise in an aqueous medium 20 to 60 wt % of an ink composition containing the following components:

| Water-Based Ink Composition | |
|---|---|
| 1 to 50 wt % | Pigment |
| 0 to 50 wt % | Pigment Dispersant/Grind Resin |
| 0 to 50 wt % | Clay base in appropriate resin solution vehicle |
| 5 to 99.9 wt % | Water-Borne/Water-Dispersible/Water-Soluble Resins |
| 0 to 30 wt % | Coalescing or Other Solvent |
| 0.01 to 10 wt % | Surfactant/Wetting Agent |
| 0.01 to 10 wt % | Processing Aids/Defoamers/Solubilizing Agents |
| 0.01 to 5 wt % | Trialkyl Urea |

A typical water-based agricultural composition to which the trialkyl urea surfactants of the invention may be added would comprise in an aqueous medium 0.01 to 80 wt % of an agricultural composition containing the following components:

| Water-Based Agricultural Composition | |
|---|---|
| 0.1 to 50 wt % | Pesticide, Insecticide, Herbicide or Plant Growth Modifying Agent |
| 0.01 to 10 wt % | Surfactant |
| 0 to 5 wt % | Dyes |
| 0 to 20 wt % | Thickeners/Stabilizers/Co-surfactants/Gel Inhibitors/Defoamers |
| 0 to 25 wt % | Antifreeze |
| 0.01 to 50 wt % | Trialkyl Urea |

A typical water-based fountain solution composition to which the trialkyl urea surfactants of the invention may be added would comprise in an aqueous medium 30 to 70 wt % of a fountain solution composition containing the following components:

| Water-Based Fountain Solution | |
|---|---|
| 0.05 to 10 wt % | Film Formable, Water Soluble Macromolecule |
| 1 to 25 wt % | Alcohol, Glycol, or C2–C12 Polyol, Water Soluble or Water Solubilizable |
| 0.01 to 20 wt % | Water Soluble Organic Acid, Inorganic Acid, or a Salt Thereof |
| 0.01 to 5 wt % | Trialkyl Urea |

A typical water-based adhesive composition to which the trialkyl urea surfactants of the invention may be added would comprise in an aqueous medium 30 to 65 wt % of an adhesive composition containing the following components:

| Water-Based Adhesive Composition | |
|---|---|
| 50 to 99 wt % | Polymeric Resin (SBR, VAE, Acrylic) |
| 0 to 50 wt % | Tackifier |
| 0 to 0.5 wt % | Defoamer |
| 0.5 to 2 wt % | Trialkyl Urea |

A typical water-based photoresist developer, or electronic cleaning, composition to which the trialkyl urea surfactants of the invention may be added would comprise an aqueous medium containing the following components:

| Water-Based Photoresist Developer Composition | |
|---|---|
| 0.1 to 3 wt % | Trimethylammonium Hydroxide |
| 0 to 4 wt % | Phenolic Compound |
| 10 to 10,000 ppm | Trialkyl Urea |

EXAMPLE 1

This example illustrates the preparation of the N,N,N'-trialkylureas of the invention using the preparation of N,N-dibutyl-N'-methylurea as representative. (The other trialkyl ureas in the Examples were prepared similarly.) A mixture of N,N'-dimethylurea (10.0 g) and di-n-butylamine (14.6 g) was slowly heated to 150° C. At this temperature, gas evolution commenced and heating was continued at 150–160° C. for about 2.5 hours. The crude product, which was a liquid, was placed in a separatory funnel and washed with about 30 mL water. About 20 mL toluene was then added to dissolve the organic layer and the solution was then washed with 20 mL 5 M HCl. A noticeable exotherm occurred at this point. The organic layer was further washed with water, dilute sodium bicarbonate solution, and finally twice more with water. The solution was dried over anhydrous magnesium sulfate, filtered, and the toluene removed on a roto-evaporator to give 12.8 g of a colorless oil (61% yield). The oil solidified over several days to give a waxy white solid (mp 46–48° C.).

In the following Examples dynamic surface tension data were obtained for aqueous solutions of various compounds using the maximum bubble pressure method at bubble rates from 0.1 bubbles/second (b/s) to 20 b/s. These data provide information about the performance of a surfactant at conditions from near-equilibrium (0.1 b/s) through extremely high surface creation rates (20 b/s). In practical terms, high bubble rates correspond to high printing speeds in lithographic printing, high spray or roller velocities in coating applications, and rapid application rates for agricultural products, as well to conditions that might lead to microbubble entrainment in electronic applications.

EXAMPLE 2

Aqueous solutions of N,N-di-isobutyl-N'-methylurea (DIBMU) were prepared and their surface tensions were measured using the procedure described above. The data are set forth in Table 1.

TABLE 1

| Dynamic Surface Tension (dyne/cm) - DIBMU | | | | | |
|---|---|---|---|---|---|
| Concentration (wt %) | 0.1 b/s | 1 b/s | 6 b/s | 15 b/s | 20 b/s |
| 0.090 | 53.3 | 53.8 | 55.0 | 56.7 | 57.3 |
| 0.500 | 40.4 | 40.6 | 41.2 | 42.1 | 42.5 |
| 1.030 | 35.2 | 35.4 | 35.7 | 36.2 | 36.7 |
| 1.511 | 34.0 | 34.3 | 34.8 | 35.1 | 35.3 |
| 2.013 | 33.8 | 34.0 | 34.3 | 34.9 | 35.2 |

These results show that N,N-di-isobutyl-N'-methylurea was effective at reducing the surface tension of water. It has not previously been recognized that trialkylureas would have the ability to reduce the surface tension of an aqueous system. The performance of this compound was particularly noteworthy under conditions in which surface was created rapidly. A 1 wt % aqueous solution of N,N-di-isobutyl-N'- methylurea maintained a surface tension below 37 dyne/cm even at the extremely high surface creation rate of 20 b/s. The outstanding performance at high surface creation rates could be extremely important in formulating water-based coating, ink, and agricultural products for high speed applications, particularly for low energy surfaces.

EXAMPLE 3

Aqueous solutions of N-butyl-N-ethyl-N'-methylurea (BEMU) were prepared and their surface tensions were measured using the procedure described above. The data are set forth in Table 2.

TABLE 2

Dynamic Surface Tension (dyne/cm) - BEMU

| Concentration (wt %) | 0.1 b/s | 1 b/s | 6 b/s | 15 b/s | 20 b/s |
|---|---|---|---|---|---|
| 0.1 | 63.2 | 63.7 | 64.4 | 64.0 | 63.8 |
| 1.0 | 46.5 | 46.8 | 47.3 | 47.9 | 48.0 |
| 2.0 | 46.8 | 41.0 | 41.5 | 42.2 | 42.6 |
| 3.0 | 37.4 | 37.5 | 37.9 | 38.5 | 38.9 |
| 5.0 | 33.0 | 33.2 | 33.7 | 34.3 | 34.8 |

The data of Table 2 illustrate that addition of N-butyl-N-ethyl-N'-methylurea also had the ability to reduce the surface tension of an aqueous composition and that low surface tension could be maintained even under conditions in which surface was created at a rapid rate. Although this material was not as efficient as N,N-di-isobutyl-N'-methylurea, a 3.0 wt % solution maintained a surface tension below 40 dyne/cm even at a rate of 20 b/s, and a 5 wt % solution maintained a surface tension below 35 dyne/cm at 20 b/s.

EXAMPLE 4

Aqueous solutions of N,N-di-n-butyl-N'-methylurea (DNBMU) were prepared and their surface tensions were measured using the procedure described above. The data are set forth in Table 3.

TABLE 3

Dynamic Surface Tension (dyne/cm) - DNBMU

| Concentration (wt %) | 0.1 b/s | 1 b/s | 6 b/s | 15 b/s | 20 b/s |
|---|---|---|---|---|---|
| 0.1 | 48.7 | 49.4 | 50.7 | 51.9 | 52.3 |
| 0.2 | 43.1 | 43.7 | 44.6 | 45.5 | 45.6 |
| 0.5 | 36.7 | 37.0 | 37.7 | 38.4 | 38.4 |

N,N-di-n-butyl-N'-methylurea is considerably more efficient than N-butyl-N-ethyl-N'-methylurea; that is, less surfactant is required to obtain an equivalent reduction in surface tension. Use of DNBMU at a level of 0.5 wt % in water allows the surface tension of water to be maintained below 39 dyne/cm, even at 20 bubbles/second. By comparison, BEMU must be used at a level of 3.0 wt % to obtain an equivalent reduction in surface tension.

EXAMPLE 5

Aqueous solutions of N,N-diamyl-N'-methylurea (DAMU) were prepared and their surface tensions were measured using the procedure described above. The data are set forth in Table 4.

TABLE 4

Dynamic Surface Tension (dyne/cm) - DAMU

| Concentration (wt %) | 0.1 b/s | 1 b/s | 6 b/s | 15 b/s | 20 b/s |
|---|---|---|---|---|---|
| 0.023 | 45.3 | 48.3 | 54.4 | 59.1 | 59.8 |
| 0.050 | 41.0 | 42.7 | 47.0 | 52.1 | 53.5 |
| 0.090 | 39.2 | 40.7 | 44.0 | 47.9 | 48.8 |

N,N-diamyl-N'-methylurea was much more efficient than N,N-di-isobutyl-N'-methylurea, particularly under conditions in which surface was not created rapidly. A 0.09 wt % aqueous solution of this surfactant provided a surface tension of under 40 dyne/cm at 0.1 b/s, although the surface tension rises to almost 50 dyne/cm at 20 b/s. DAMU would therefore be useful in applications in which surface is not created at an extremely high rate, particularly if it is desirable to use only low levels of surfactant.

EXAMPLE 6

The foaming properties of a 0.1 wt % solution of N,N-di-isobutyl-N'-methylurea, N-butyl-N-ethyl-N'-methylurea, N,N-di-n-butyl-N'-methylurea, and N,N-diamyl-N'-methylurea were examined using a procedure based upon ASTM D 1173–53. In this test, a 0.1 wt % solution of the surfactant is added from an elevated foam pipette to a foam receiver containing the same solution. The foam height is measured at the completion of the addition ("Initial Foam Height") and the time required for the foam to dissipate at the air-liquid interface ("Time to 0 Foam") is recorded. This test provides a comparison between the foaming characteristics of various surfactant solutions. In general, in coatings, inks, adhesives, fountain solutions and agricultural formulations, foam is undesirable because it complicates handling and can lead to coating and print defects, and to inefficient application of agricultural materials. The data are presented in Table 5.

TABLE 5

Foam Test Data

| Compound | Initial Foam Height (cm) | Time to 0 Foam |
|---|---|---|
| N,N-di-isobutyl-N'-methylurea | 1.9 | 13 s |
| N-butyl-N-ethyl-N'-methylurea | 4.0 | 6 s |
| N,N-di-n-butyl-N'-methylurea | 1.0 | 21 s |
| N,N-diamyl-N'-methylurea | 0.4 | 3 s |

The ability of a surfactant in aqueous systems to reduce surface tension under both equilibrium and dynamic conditions is of great importance in the performance of water-based coatings, inks, adhesives, fountain solutions, agricultural compositions and photoresist developing and electronics cleaning compositions. Low equilibrium surface tension allows the development of excellent properties subsequent to application. Low dynamic surface tension results in enhanced wetting and spreading under the dynamic conditions of application, resulting in more efficient use of the formulations and fewer defects. In waterborne coating, ink, adhesive, fountain solution, agricultural and photoresist solution and electronics cleaning compositions, the formation of foam is generally undesirable because it complicates handling and can cause defects or result in inefficient application.

That trialkylureas would exhibit surface activity would not be anticipated based on the teachings of the prior art. Although ureas have been studied in detergent applications, their role appears to have been to act as adjuvants to conventional detergents and not as surfactants themselves. In particular, surfactancy by relatively short chain trialkylureas is not apparent from the prior art. A property which is particularly not apparent from the prior art is the outstanding dynamic properties shown by ureas in reducing the surface tension of aqueous compositions under conditions of high surface creation rates.

Statement of Industrial Application

The invention provides compositions suitable for reducing the equilibrium and dynamic surface tension in water-based coating, ink, adhesive, fountain solution, agricultural, photoresist developing and electronics cleaning compositions.

We claim:

1. In a method for applying a coating of a water-based composition to a surface to partially or fully coat the surface, the composition containing an inorganic or organic compound and an effective amount of a surfactant for reducing the dynamic surface tension of the composition, the improvement which comprises employing as the surfactant a trialkyl urea of the structure

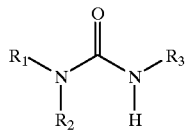

where $R_1$ and $R_2$ are C2 to C6 alkyl groups, $R_3$ is methyl or ethyl, and the total number of carbon atoms in $R_1$, $R_2$ and $R_3$ is from 6 to 14.

2. The method of claim 1 in which the water-based composition is selected from the group consisting of aqueous organic coating, ink, adhesive, fountain solution, agricultural, photoresist developing and electronic cleaning compositions.

3. The method of claim 2 in which an aqueous solution of the trialkyl urea demonstrates a dynamic surface tension of less than 45 dynes/cm at a concentration of $\leq 5$ wt % in water at 23° C. and 1 bubble/second according to the maximum-bubble-pressure method.

4. The method of claim 2 in which $R_1$ and $R_2$ contain a total of 6–12 carbon atoms.

5. The method of claim 4 in which $R_1$ and $R_2$ contain a total of 8–10 carbon atoms.

6. The method of claim 1 in which $R_3$ is a methyl group.

7. The method of claim 1 in which the trialkyl urea is N,N-di-isobutyl-N'-methylurea, N-butyl-N-ethyl-N'-methylurea, N,N-di-n-butyl-N'-methylurea, or N,N-diamyl-N'-methylurea.

8. The method of claim 2 in which the trialkyl urea is N,N-di-isobutyl-N'-methylurea.

9. The method of claim 3 in which the measurement is made at 20 bubbles/second.

10. An aqueous composition comprising in water an inorganic compound which is a mineral ore or a pigment or an organic compound which is a pigment, a polymerizable monomer, an oligomeric resin, a polymeric resin, a detergent, a herbicide, an insecticide, or a plant growth modifying agent and an effective amount of a trialkyl urea for reducing the dynamic surface tension of the composition, the trialkyl urea having the structure

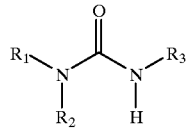

where $R_1$ and $R_2$ are C2 to C6 alkyl groups, $R_3$ is methyl or ethyl, and the total number of carbon atoms in $R_1$, $R_2$ and $R_3$ is from 6 to 14.

11. The aqueous composition of claim 10 in which an aqueous solution of the trialkyl urea demonstrates a dynamic surface tension of less than 45 dynes/cm at a concentration of $\leq 5$ wt % in water at 23° C. and 1 bubble/second according to the maximum-bubble-pressure method.

12. The aqueous composition of claim 11 in which $R_1$ and $R_2$ contain a total of 6–12 carbon atoms.

13. The aqueous composition of claim 11 in which $R_1$ and $R_2$ contain a total of 8–10 carbon atoms.

14. The aqueous composition of claim 10 in which $R_3$ is a methyl group.

15. The aqueous composition of claim 11 in which the trialkyl urea is N,N-di-isobutyl-N'-methylurea, N-butyl-N-ethyl-N'-methylurea, N,N-di-n-butyl-N'-methylurea, or N,N-diamyl-N'-methylurea.

16. The aqueous composition of claim 10 in which the trialkyl urea is N,N-di-isobutyl-N'-methylurea.

17. The aqueous composition of claim 11 in which the measurement is made at 20 bubbles/second.

18. The composition of claim 10 which is an aqueous organic coating composition comprising in water 30 to 80 wt % of a coating composition which comprises the following components 0 to 50 wt % pigment dispersant, grind resin or mixtures thereof;

0 to 80 wt % coloring pigment, extender pigment, anti-corrosive pigment, other pigment types or mixtures thereof;

5 to 99.9 wt % water-borne, water-dispersible or water-soluble resin or mixtures thereof;

0 to 30 wt % slip additive, antimicrobial agent, processing aid, defoamer or mixtures thereof;

0 to 50 wt % coalescing or other solvent;

0.01 to 10 wt % surfactant, wetting agent, flow and leveling agents or mixtures thereof; and 0.01 to 20 wt % trialkyl urea.

19. The composition of claim 10 which is an aqueous ink composition comprising in water 20 to 60 wt % of an ink composition which comprises the following components 1 to 50 wt % pigment;

0 to 50 wt % pigment dispersant, grind resin or mixtures thereof;

0 to 50 wt % clay base in a resin solution vehicle;

5 to 99 wt % water-borne, water-dispersible or water-soluble resin or mixtures thereof;

0 to 30 wt % coalescing or other solvent;

0.01 to 10 wt % processing aid, defoamer, solubilizing agent or mixtures thereof;

0.01 to 10 wt % surfactant, wetting agent or mixtures thereof; and 0.01 to 20 wt % trialkyl urea.

20. The composition of claim 10 which is an aqueous agricultural composition comprising in water 0.01 to 80 wt % of an agricultural composition which comprises the following components 0.1 to 50 wt % a herbicide, insecticide, plant growth modifying agent or mixtures thereof;

0.01 to 10 wt % surfactant;

0 to 5 wt % dye;

0 to 20 wt % thickener, stabilizer, co-surfactant, gel inhibitor, defoaming agent or mixtures thereof;

0 to 25 wt % antifreeze; and 0.01 to 50 wt % trialkyl urea.

21. The composition of claim 10 which is an aqueous fountain solution composition comprising in water 30 to 70 wt % of an fountain solution composition which comprises the following components 0.05 to 10 wt % film formable, water soluble macromolecule;

1 to 25 wt % alcohol, glycol, or polyol with 2–12 carbon atoms which is water soluble or can be made water soluble;

0.01 to 20 wt % water soluble organic acid, inorganic acid, or a salt thereof;

0.01 to 5 wt % trialkyl urea.

22. The composition of claim 10 which is an aqueous adhesive composition comprising in water 30 to 65 wt % of an adhesive composition which comprises the following components 50 to 99 wt % polymeric resin;

0 to 50 wt % tackifier;

0 to 0.5 wt % defoamer; and 0.5 to 2 wt % trialkyl urea.

23. The composition of claim 10 which is an aqueous electronic cleaning composition comprising in water the following components 0.1 to 3 wt % trimethylammonium hydroxide;

0 to 4 wt % phenolic compound; and 10 to 10,000 ppm trialkyl urea.

* * * * *